United States Patent
Stefanov et al.

(10) Patent No.: US 9,559,198 B2
(45) Date of Patent: Jan. 31, 2017

(54) SEMICONDUCTOR DEVICE AND METHOD OF MANUFACTURE THEREFOR

(71) Applicant: FREESCALE SEMICONDUCTOR, INC., Austin, TX (US)

(72) Inventors: Evgueniy Stefanov, Vielle Toulouse (FR); Edouard de Fresart, Tempe, AZ (US); Philippe Dupuy, Toulouse (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/912,346

(22) PCT Filed: Aug. 27, 2013

(86) PCT No.: PCT/IB2013/002209
§ 371 (c)(1),
(2) Date: Feb. 16, 2016

(87) PCT Pub. No.: WO2015/028838
PCT Pub. Date: Mar. 5, 2015

(65) Prior Publication Data
US 2016/0197176 A1    Jul. 7, 2016

(51) Int. Cl.
*H01L 29/76* (2006.01)
*H01L 29/94* (2006.01)
(Continued)

(52) U.S. Cl.
CPC ......... *H01L 29/7811* (2013.01); *H01L 27/088* (2013.01); *H01L 29/0642* (2013.01);
(Continued)

(58) Field of Classification Search
CPC ............. H01L 29/7813; H01L 29/4236; H01L 29/66734; H01L 29/1095; H01L 29/407; H01L 29/7811
(Continued)

(56) References Cited

U.S. PATENT DOCUMENTS 4,656,493 A    4/1987  Adler et al.
5,420,451 A    5/1995  Williams et al.
(Continued)

FOREIGN PATENT DOCUMENTS

EP    1 887 698 A2    2/2008
EP    2 533 246 A1    12/2012
(Continued)

OTHER PUBLICATIONS

Arzumanyan, Aram et al; "Flip Chip Power MOSFET: A New Wafer Scale Packaging Technique"; Proceedings of 2001 International Symposium on Power Semiconductor Devices & ICs, Osaka; pp. 251-254 (Jun. 2001).
(Continued)

*Primary Examiner* — Theresa T Doan
(74) *Attorney, Agent, or Firm* — Charlene R. Jacobsen

(57) ABSTRACT

A semiconductor device comprises a first contact layer, a first drift layer adjacent the first contact layer, a buried body layer adjacent the first drift layer and a second contact layer. A first vertical trench and a second vertical trench are provided, the first and second vertical trenches being spaced with respect to each other and extending from the second contact layer to substantially beyond the buried body layer. A second drift layer is also provided and sandwiched between the buried body layer and the second contact layer.

20 Claims, 12 Drawing Sheets

(51) Int. Cl.

| | |
|---|---|
| *H01L 29/78* | (2006.01) |
| *H01L 29/40* | (2006.01) |
| *H01L 29/423* | (2006.01) |
| *H01L 29/66* | (2006.01) |
| *H01L 29/08* | (2006.01) |
| *H01L 27/088* | (2006.01) |
| *H01L 29/06* | (2006.01) |
| *H01L 29/10* | (2006.01) |

(52) U.S. Cl.
 CPC ........ *H01L 29/086* (2013.01); *H01L 29/0865* (2013.01); *H01L 29/0882* (2013.01); *H01L 29/1095* (2013.01); *H01L 29/404* (2013.01); *H01L 29/407* (2013.01); *H01L 29/4236* (2013.01); *H01L 29/42376* (2013.01); *H01L 29/66734* (2013.01); *H01L 29/7813* (2013.01)

(58) Field of Classification Search
 USPC ........................................................ 257/334
 See application file for complete search history.

(56) References Cited

U.S. PATENT DOCUMENTS

| | | | |
|---|---|---|---|
| 5,682,050 A | 10/1997 | Williams | |
| 5,767,733 A | 6/1998 | Grugett | |
| 5,945,708 A | 8/1999 | Tihanyi | |
| 6,043,965 A | 3/2000 | Hazelton et al. | |
| 6,049,108 A | 4/2000 | Williams et al. | |
| 6,096,608 A | 8/2000 | Williams | |
| 6,650,520 B2 | 11/2003 | He | |
| 6,781,195 B2 | 8/2004 | Wu et al. | |
| 6,943,408 B2 | 9/2005 | Wu et al. | |
| 7,282,406 B2 | 10/2007 | Grivna et al. | |
| 7,283,343 B2 | 10/2007 | Grose et al. | |
| 7,297,603 B2 | 11/2007 | Robb et al. | |
| 7,352,036 B2* | 4/2008 | Grebs ................. H01L 29/0653 257/332 |
| 7,508,277 B2 | 3/2009 | Kuo et al. | |
| 7,537,970 B2 | 5/2009 | Robb et al. | |
| 7,605,435 B2 | 10/2009 | Anderson et al. | |
| 7,807,536 B2* | 10/2010 | Sreekantham ...... H01L 29/4925 257/333 |
| 7,910,409 B2 | 3/2011 | Robb et al. | |
| 8,049,568 B2 | 11/2011 | Youssef et al. | |
| 8,101,969 B2 | 1/2012 | Robb et al. | |
| 8,120,984 B2 | 2/2012 | Huang et al. | |
| 8,247,867 B2 | 8/2012 | Nakata et al. | |
| 8,269,263 B2 | 9/2012 | Li et al. | |
| 8,431,989 B2 | 4/2013 | Bhalla et al. | |
| 8,530,284 B2 | 9/2013 | Robb et al. | |
| 8,541,833 B2 | 9/2013 | Schulze et al. | |
| 8,642,425 B2 | 2/2014 | Burke et al. | |
| 8,653,587 B2 | 2/2014 | Hsieh | |
| 8,907,394 B2 | 12/2014 | Hossain | |
| 8,947,156 B2 | 2/2015 | Stultz et al. | |
| 9,123,559 B2 | 9/2015 | Meiser et al. | |
| 9,159,786 B2 | 10/2015 | Chen | |
| 9,269,779 B2 | 2/2016 | Deng et al. | |
| 9,443,845 B1 | 9/2016 | Stafanov et al. | |
| 2001/0043112 A1 | 11/2001 | Voldman | |
| 2007/0004116 A1 | 1/2007 | Hshieh | |
| 2007/0205431 A1 | 9/2007 | Robb et al. | |
| 2008/0023473 A1 | 1/2008 | Spyros et al. | |
| 2008/0111642 A1 | 5/2008 | Bohorquez | |
| 2008/0121995 A1 | 5/2008 | Anderson et al. | |
| 2009/0261446 A1 | 10/2009 | Gogoi | |
| 2010/0187602 A1* | 7/2010 | Woolsey ........... H01L 21/28229 257/330 |
| 2011/0127573 A1 | 6/2011 | Robb et al. | |
| 2012/0025305 A1 | 2/2012 | Takeda | |
| 2012/0049187 A1 | 3/2012 | Haruyama et al. | |
| 2012/0083075 A1 | 4/2012 | Robb et al. | |
| 2012/0175635 A1 | 7/2012 | Weis et al. | |
| 2012/0326227 A1 | 12/2012 | Burke et al. | |
| 2013/0249602 A1 | 9/2013 | Mauder et al. | |
| 2013/0344667 A1* | 12/2013 | Qin ..................... H01L 29/7813 438/270 |
| 2014/0009212 A1 | 1/2014 | Altunkilic et al. | |
| 2014/0021484 A1 | 1/2014 | Siemieniec et al. | |
| 2014/0084362 A1 | 3/2014 | Schloesser et al. | |
| 2014/0367773 A1 | 12/2014 | Poelzl | |
| 2015/0028416 A1 | 1/2015 | Zundel et al. | |
| 2015/0069610 A1 | 3/2015 | Grivna | |
| 2015/0102403 A1 | 4/2015 | Kuruc et al. | |
| 2015/0145030 A1 | 5/2015 | Meiser et al. | |
| 2015/0162324 A1 | 6/2015 | Mauder et al. | |
| 2016/0126348 A1 | 5/2016 | Deng et al. | |
| 2016/0197176 A1 | 7/2016 | Stefanov et al. | |

FOREIGN PATENT DOCUMENTS

| | | |
|---|---|---|
| WO | WO-95/30277 A1 | 11/1995 |
| WO | WO-00/19540 A1 | 4/2000 |

OTHER PUBLICATIONS

International Search Report for Application No. PCT/IB2013/002209 (Aug. 27, 2013).

Robb, Francine et al; "A New P-channel Bidirectional Trench Power MOSFET for Battery Charging and Protection"; Proceedings of the 22nd International Symposium on Power Semiconductor Devices & ICs, Hiroshima; pp. 405-408 (Jun. 2010).

Sawada, Mutsumi et al; "High side n-channel and bidirectional Trench Lateral Power MOSFETs on one chip for DCDC converter ICs"; Proceedings of the 20th International Symposium on Power Semiconductor Devices & IC's, Orlando, Florida, US; (May 2008).

Extended European Search Report for application 15199239.3; 9 pages (Jul. 7, 2016).

Notice of Allowance for U.S. Appl. No. 14/870,333; 13 pages; (Jun. 13, 2016).

Notice of Allowance for U.S. Appl. No. 14/870311; 20 pages; (May 16, 2016).

Restriction for U.S. Appl. No. 14/870,333; 7 pages; (Mar. 22, 2016).

U.S. Appl. No. 15/132,855, not yet published; 23 pages (Apr. 19, 2016).

\* cited by examiner

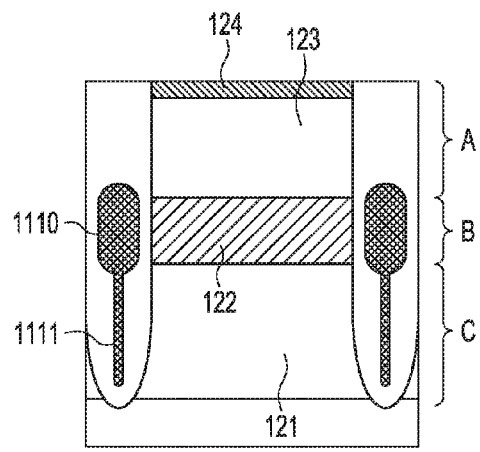
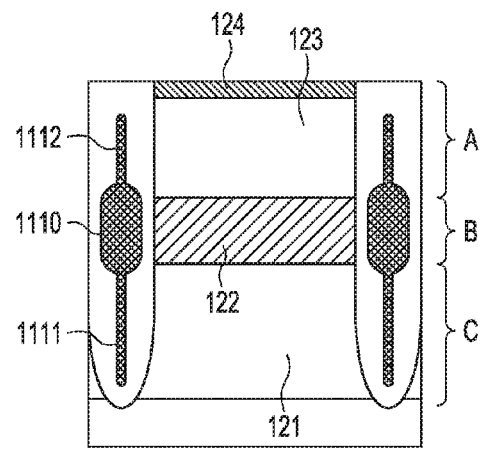
FIG. 25  FIG. 26
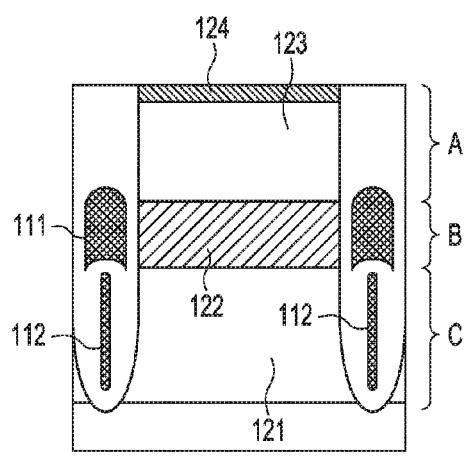
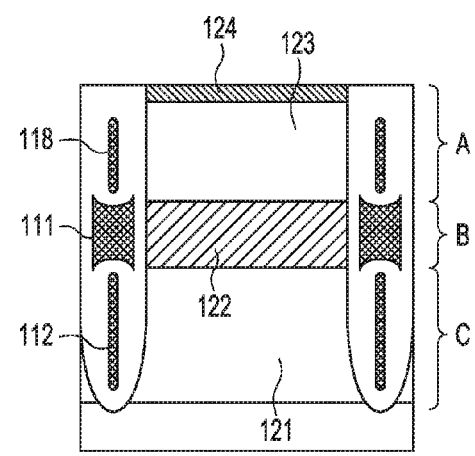
FIG. 27  FIG. 28

US 9,559,198 B2

SEMICONDUCTOR DEVICE AND METHOD OF MANUFACTURE THEREFOR

FIELD OF THE INVENTION

This invention relates to a semiconductor device and a method of manufacture therefor.

BACKGROUND OF THE INVENTION

Bi-directional switches switch high currents through their conduction electrodes while blocking high voltages applied to the conduction electrodes. Bi-directional switches are used in a variety of electrical systems. A typical bi-directional switch is specified to supply high currents, which may range from several Amperes of maximum current to several hundreds of Amperes depending on the specific switch and application, while blocking relatively high voltages, e.g. of at least 25 V without breaking down.

Bi-directional switches are typically implemented using electromechanical switches or a configuration of semiconductor devices, e.g. power transistors. However, standard power transistors have a low blocking voltage in one direction, making them unidirectional devices. Consequently, current bi-directional switches typically are implemented using two separate serially coupled power MOSFETs. The separate MOSFETs are formed on separate semiconductor dice, and often housed in separate packages, which results in a high manufacturing cost and a large area occupied on a circuit board. When the separate MOSFET dice are housed in a single package and interconnected with wire bonds, the area occupied on a circuit board is reduced but the manufacturing cost is still too high for many applications.

U.S. Pat. No. 8,101,969 discloses an integrated circuit with several different transistors integrated on the same circuit, including a p-channel bi-directional trench power transistor for battery charging protection. The transistor comprises two vertical trenches between which a body is present. The body is separated from current carrying electrodes above and below the body by high-voltage regions with a lesser doping concentration than the electrodes.

However, a disadvantage of the bi-directional trench power transistor disclosed in U.S. Pat. No. 8,101,969 is that it exhibits a potential to breakdown unexpectedly. Furthermore, it exhibits a slow switching behaviour.

SUMMARY OF THE INVENTION

The present invention provides a power transistor, a semiconductor product and methods as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIGS. 25 to 31 are schematic diagrams of alternative gate structures for the device of FIG. 1.

DETAILED DESCRIPTION OF THE PREFERRED EMBODIMENTS

Because the illustrated examples may for the most part, be implemented using techniques, processes and components known to those skilled in the art, details will not be explained in any greater extent than that considered necessary for the understanding and appreciation of the underlying concepts of the examples set forth herein and in order not to obfuscate or distract from the teachings herein.

Figure 1:
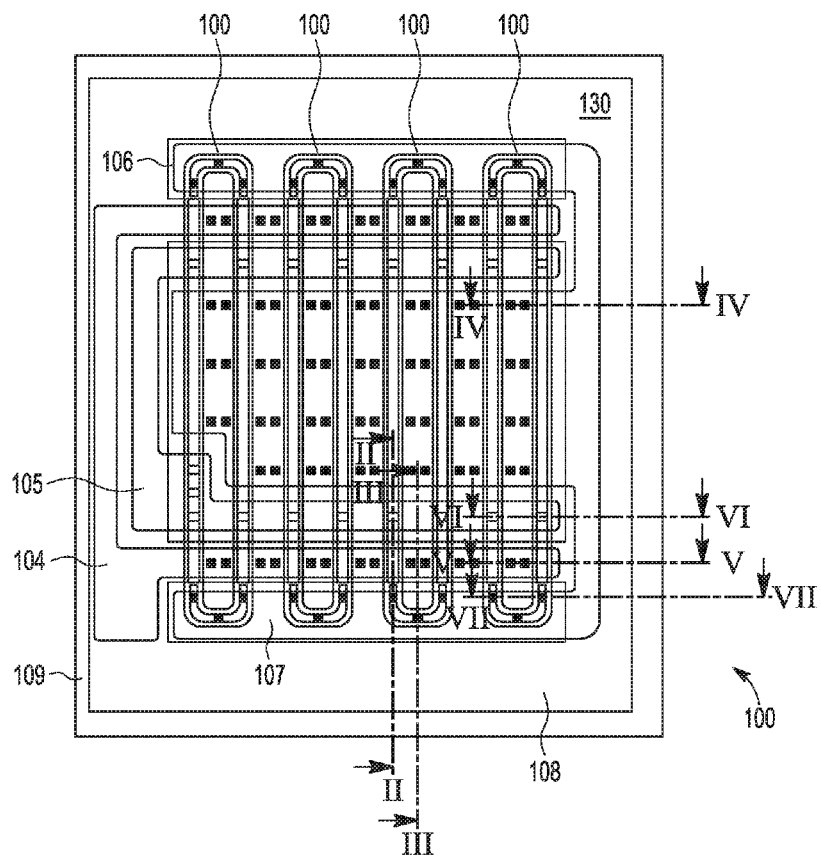
FIG. 1 is a schematic plan view of a semiconductor product comprising a plurality of power transistors.

Referring now to FIG. 1, the example of a semiconductor product shown comprises an arrangement of a plurality of power transistors 100. The power transistors 100 have a cellular structure and each power transistor 100 forms a cell of the semiconductor product. Depending on the specific implementation, the semiconductor product may comprise several tens, hundreds, thousands or more cells in a suitable arrangement (e.g. 2-dimensional matrix) and connected to form a single power transistor device. The power transistors 100 will be described in more detail with reference to the sectional views of FIGS. 2-7. In FIG. 1, the power transistors 100 are connected in parallel, and several electrodes 104-107, also referred to as feeds, are visible. The electrodes 104-107 extend over a layer stack in which the transistors 100 are provided. As shown more clearly in FIGS. 2-3, the electrodes 104-107 are covered by a passivation layer 103 of a suitable dielectric material, which in FIG. 1 is not shown for the sake of clarity. The passivation layer 103 shields the electrodes 104-107 and the rest of the top-surface 130 of the semiconductor product from ambient influences, such as oxidations or otherwise.

Figure 2:
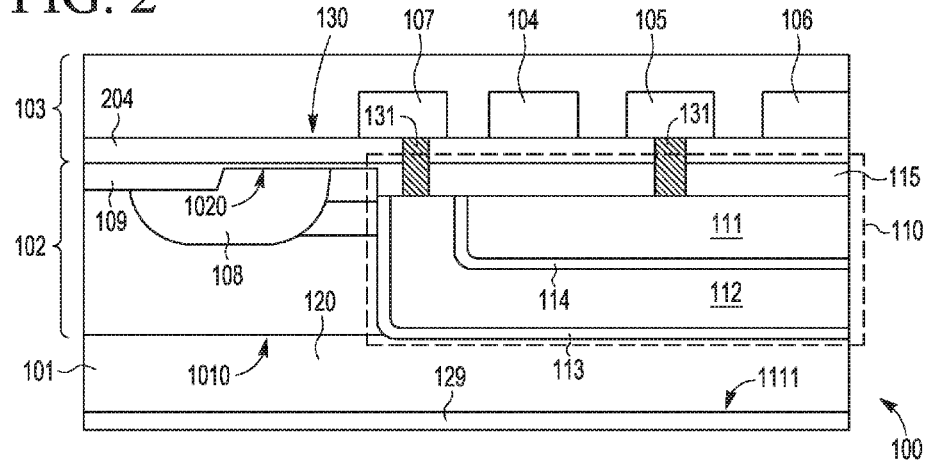
FIG. 2 is a sectional view of a part of the example of FIG. 1, taken along the line II-II, through a vertical trench in parallel with a longitudinal direction of the vertical trench.
Figure 3:
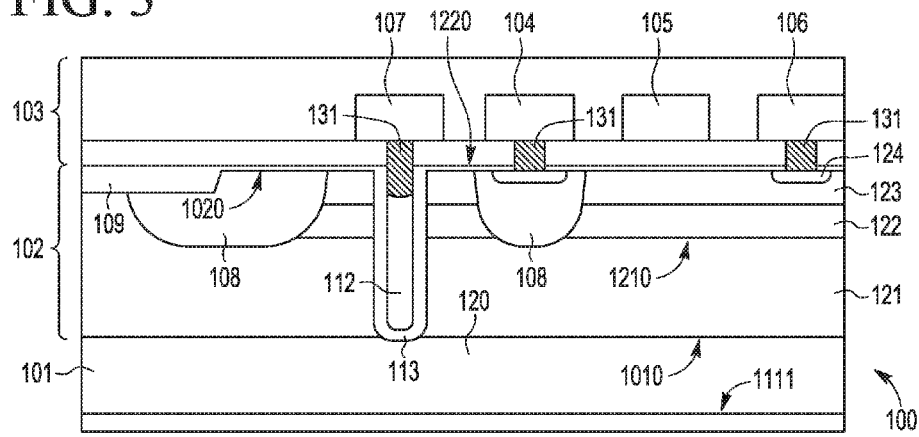
FIG. 3 is a sectional view of a part of the example of FIG. 1 taken along the line III-III in the longitudinal direction, though the centre of a power transistor.
Figure 4:
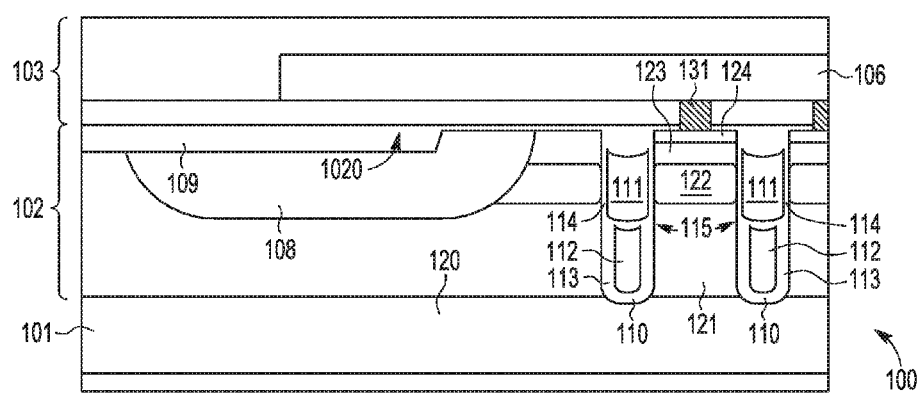
FIG. 4 is a sectional view of a part of the example of FIG. 1 taken along the line IV-IV, in a perpendicular direction perpendicular to the longitudinal direction, through the source electrode.

The semiconductor product comprise a first current electrode 129, e.g. in this example the drain electrode, which is connected to the first current terminal 120, e.g. the drain, of each of the power transistors 100. In FIG. 1 the first current electrode is not visible, but as shown in FIG. 2 present at the backside of the substrate 101, and extends over the bottom surface 1111 of the substrate. A second current electrode 106, e.g. the source electrode, is connected to the second current terminal 124, e.g. the source, of each of the power transistors shown. A gate feed 105 is connected to the gate electrode 111 of each power transistor 100.

As shown in the example of FIG. 1, the semiconductor product may further comprise a body electrode 104 connectable to an external power supply and connected to the body 122 of each of the power transistors 100. Alternatively, the body 122 may be a fully floating body or be coupled to the current terminals 120,124 and the semiconductor product be without a dedicated body electrode 104.

In the example of FIG. 1, the second current electrode 106 is further connected to the shield plate of each of the power transistors 100. In the shown example, a finger 107 of the second current electrode is connected to the shield plates 112, e.g. through one or more vias 131 extending through an inter-layer dielectric 204. However, the finger 107 may alternatively be separate from the second current electrode 106 and thus be a shield feed via which the voltage of the shield gate can be controlled separately from the voltage and/or current of the other electrodes 104-106.

Each of the electrodes or feeds 104-107 present in the semiconductor product is connectable to an external power supply, not shown. The connection between the electrodes and feed and the external power supply may be provided in any conventional manner, and is not described in further detail.

The arrangement may, as in the example, be provided with an enclosure which isolates or protects the arrangement. For instance, in FIG. 1, the arrangement is enclosed by, a well 108 of a conductivity type opposite to that of the first current terminal 120, which in turn is enclosed by a shallow trench isolation, STI, 109 at the top of the layer stack.

The well 108 extends in lateral direction partly under the STI 109 and is in direct contact with the STI. The well 108 extends in vertical direction from the top of the layer stack 102 towards the substrate 101 in a layer 102 of the same conductivity type as the first drift region 121 of the transistors 100. In this example the layer 102 has the same concentration of majority charge carriers as the first drift region 121 and is a doped semiconductor layer with the same doping concentration as the first drift region 121.

Figure 5:
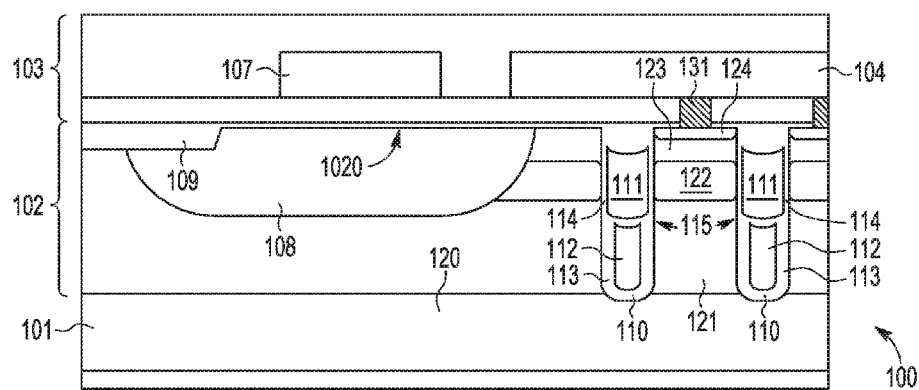
FIG. 5 is a sectional view of a part of the example of FIG. 1 taken along the line V-V, in a perpendicular direction, through the body electrode.
Figure 6:
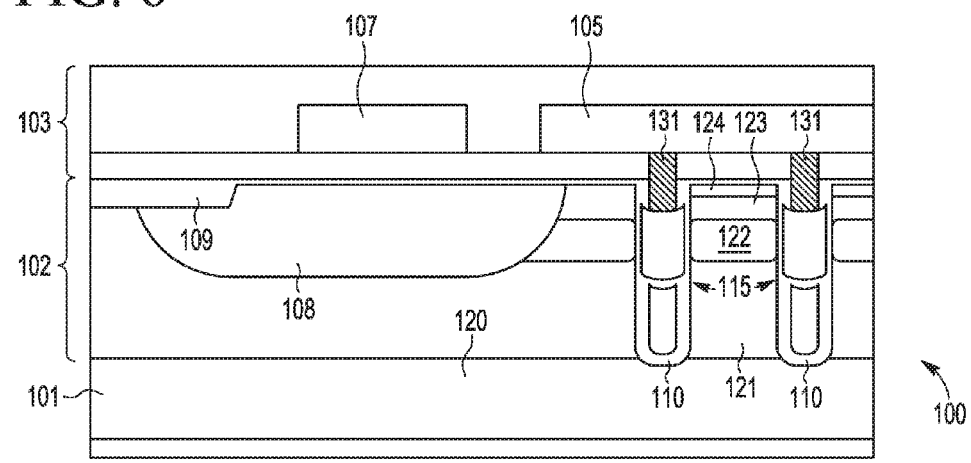
FIG. 6 is a sectional view of a part of the example of FIG. 1 taken along the line VI-VI, in the perpendicular direction, through the gate feed.
Figure 7:
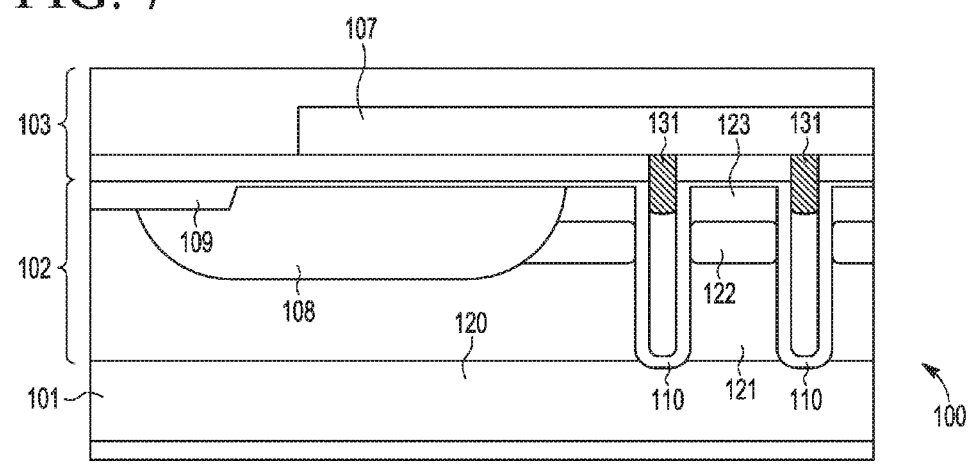
FIG. 7 is a sectional view of a part of the example of FIG. 1 taken along the line VII-VII, in the perpendicular direction, through the part of the source electrode connected to a shield gate of the power transistor.

The well 108 is separated from the vertical trenches 110 of the transistors 100 and from the substrate 101 by the layer 102, as more clearly shown in FIG. 2, except in the area covered by the body electrode 104. As can be seen in FIG. 5, the well extends laterally under the body electrode 104, and vertically from the top of the layer stack 102 to the bottom of the gate electrode, and contacts the inner and outer side-walls of the trenches from the top of the layer stack 102 to the bottom of the gate electrode. Below the top-surface 1020 of the layer stack 102, the well 108 overlaps in vertical direction with a high-voltage layer which extends in lateral direction until the outer vertical sidewall of the vertical trench 100.

Referring now to the sectional views of FIGS. 2-7, the bi-directional trench field effect power transistor 100 shown therein can support high energies, i.e. high currents and/or voltages. The power transistor may for example have a current maximum of more than 1 A, such as 10 A or more, such as 100 A or more, such as at least 200 A and/or a positive drain-source break down voltage of at least 25 V, for example 50 V or more, and a negative drain-source break down voltage of at least 25 V, for example 30 V or more, such as 50 V or more, for example 100 V or more, e.g. 300 V or more. The bi-directional trench field effect power transistor may be symmetric with positive and negative break down voltages that have the same absolute value, or be a-symmetric, with different values, depending on the specific implementation. For an a-symmetric transistor, a suitable positive breakdown voltage has found to be between 1.5 and 2 times that of the negative breakdown voltage, such as 45 V for a 25 V negative breakdown voltage. For instance, depending on the specific implementation the thickness of the first and/or second drift region may be adapted to obtain a breakdown voltage for the specific implementation.

The power transistor 100 comprises a first current terminal 120, e.g. a drain, and a second current terminal 124, e.g. a source. The power transistor comprises a substrate 101 with a substrate top surface 1010. A layer stack 102 extends over the substrate top surface 1010. The first current terminal 120 is situated, in a vertical direction from a top layer 1020 of the stack 102 towards the substrate 101, below the second current terminal 124.

An electrical path is present between the first current terminal 120 and the second current terminal 124. The electrical path can be selectively enabled or disabled to allow current to flow in a first direction, e.g. from the first current terminal to the second terminal or a second direction, opposite to the first direction, as explained below in more detail. The electrical path comprises a first drift region 121, a body 122 and a second drift region 123. The body 122 extends laterally between vertical trenches 100. The body 122 extends vertically between the first current terminal 120 and the second current terminal 124. The first drift region 121 extends, in the vertical direction, between the body 122 and the first current terminal 120. The second drift region 123 extends, in the vertical direction, between the body 122 and the second current terminal 124.

In the stack 102, a first vertical trench 110 and a second vertical trench are present. Each of the vertical trenches 110 extends in the vertical direction from a top layer of the stack towards the substrate 101, in lateral direction between vertical sidewalls. Hereinafter, the vertical sidewalls of the trenches 100 closest to, and facing towards, the body 122 are referred to as the inner sidewalls and the vertical sidewalls facing away from the body are referred to as the outer sidewalls. In the example of FIGS. 2-7, the inner sidewalls define the current path laterally as more clearly visible in FIG. 4-7.

In the shown example, each of the first and second vertical trenches 100 comprises a gate electrode 111 in a first part of the vertical trench 110. The gate electrode 111 is electrically isolated from the body 122 by a gate dielectric, in this example formed by a gate dielectric layer 114 lining the inner sidewall in the first part of the trench. The gate electrode 111 is coupled to the body 122 and, when a suitable voltage is applied to the gate electrode, e.g. through the gate feed 105 in the example of FIG. 1, a vertical channel is formed in the body 122. Through the vertical channel a current can flow from the first drift region 121 to the second drift region 122, when the first current terminal 120 is at a positive voltage with respect to the second current terminal 124, or vice versa when the second current terminal 124 is at a positive voltage with respect to the first current terminal 120.

The first and second vertical trenches 110 extend, in the vertical direction, from the top layer beyond an upper boundary 1210 of the first drift region 121, and in a lateral direction parallel to the substrate top-surface electrically isolate, and define, the first drift region 121. Thereby, the risk on an unexpected breakdown of a transistor 100 can be reduced. Without being bound to theory, it is believed that one of the causes of an unexpected breakdown is voltage and/or current events in other power transistors or devices.

Furthermore, it is believed that by isolating the first drift region 121 in the lateral direction, switching speed can be increased since less charge carriers need to be recombined when switching off, i.e. only those in the region between the first and second vertical trenches 110, rather than in the entire drift region.

Each of the first and second vertical trenches 100 comprises a lower shield plate 112. The lower shield plate 112 is in this example additional to the lateral isolation of the first drift region 121 by the vertical trench 110. However, it should be apparent that the lower shield plate 112 may be used without the lateral isolation of the first drift region 121, and that the lateral isolation of the first drift region may be used without a shield plate. The shield plate 112 is situated in a lower part of the trench 100. This lower part is closer to the substrate 101 than the first part.

The shield plate 112 is capable of generating a vertical accumulation layer in the first drift region 121, e.g. along the inner sidewall of the trench, when the voltage lower shield plate 112 is biased with respect to the voltage of the first current terminal 120 in a first polarity. For example, in case the first current terminal is an n-doped semiconductor material, the accumulation layer can be generated when the lower shield plate 112 is sufficiently positively biased. In case the first current terminal is a p-doped semiconductor material, the accumulation layer can be generated when the lower shield plate 112 is sufficiently negatively biased. In the shown examples the accumulation layer will extend in vertical direction through the whole first drift region, from the bottom limit of the body region 121 up to the first current terminal 120. Thus, a conductive path between the body and the first current terminal 120 may be established in a relatively fast manner. However, depending on the specific implementation, the accumulation layer may extend in vertical direction through a part of the first drift region 121 only, and e.g. be spaced from the body or the first current terminal.

The shield plate 112 can further locally reduce the electrical field density in parts of the first drift region when the lower shield plate is biased with respect to the first current terminal in a second polarity. For example, in case the first current terminal is an n-doped semiconductor material, the reduction is obtained when the lower shield plate 112 is sufficiently negatively biased. For example, in case the first current terminal is an n-doped semiconductor material, the reduction is obtained when the lower shield plate 112 is sufficiently negatively biased.

Thus, unexpected breakdown may be reduced because overly high electric fields in the first drift region may be avoided while the speed of switching may be improved since the current path through the drift region can be enabled more rapidly by creating the accumulation layer.

The power transistor 100 may have any suitable shape and size. As shown in FIG. 1 in the examples the power transistor 100 is defined by an elongated vertical trench enclosure which, in a plane parallel to the substrate topsurface 1010, encloses the electrical path. In this example, the terms first vertical trench and second vertical trench are used for convenience to denote the trench part at opposite sides of the electrical path, but in fact are integral part of the elongated vertical trench enclosure. Likewise, the elongated vertical trench enclosure comprises an elongated enclosing gate electrode which comprises the gate electrodes of the vertical trenches, and an enclosing lower shield plate which comprises the lower shield plates of the vertical trenches, the enclosing gate electrode enclosing the body and the enclosing lower shield plate enclosing the first drift region. It will be apparent that the enclosing shield plate may be absent when the transistor is implemented without shield plate(s).

The vertical trenches 100 may be implemented in any manner suitable for the specific implementation. The first and second vertical trenches 100 are very deep trenches which extend in the example of FIGS. 2-7 from the top of the layer stack 102 into the substrate 101. However the vertical trenches may be less deep, and for example extend until the substrate top surface, i.e. the bottom of the trench touching the substrate top surface 1010. Likewise, the vertical trenches may terminate slightly above the substrate 101, for example at a vertical position closer to the substrate top surface 1010 than to the middle of the vertical drift layer, or expressed mathematically $d_{trench} > 0.75\, d_{drift}$, where $d_{trench}$ represents the depth of the trench in the drift region, and $d_{drift}$ the vertical thickness of the drift region.

Also, the vertical trenches 100 may be provided, in addition to the gate electrode and the shield plate, with other elements of the power transistor 100. For instance, as shown in FIG. 27 each vertical trench 100 may further comprise an upper shield plate 118. The upper shield plate 118 may be controlled in a similar manner as the lower shield plate 112 and be arranged to generate an accumulation layer in the second drift region 123 when the upper shield plate 118 is biased with respect to the second current terminal 124 in the first polarity and reducing, at least locally, the electrical field density when the upper shield plate 118 is biased with respect to the second current terminal 124 in the second polarity. There, unexpected breakdown may be reduced because overly high electric fields in the second drift region may be avoided while the speed of switching may be improved since the current path through the second drift region can be enabled more rapidly by creating the accumulation layer. As shown, the upper shield plate 118 may have a similar shape as the lower shield plate and be separated from the second drift region 123 by a suitable dielectric, in this example of the same material and thickness as the shield dielectric of the lower shield plate.

Also, the vertical trenches may be filled, e.g. with the electrodes 111,113 and dielectrics 112,114 in any suitable manner. In the shown example, for instance the vertical trenches extend into the substrate 101 and the shield plate 112 terminates above the substrate 101. The shield plate 112 is isolated from the substrate by a thick dielectric at the bottom of the trench 100. Thereby, the substrate 101 operation can be effectively decoupled from the voltage of the shield plate 112.

Furthermore, at least the inner sidewall of the vertical trenches, and in this example both the inner and outer sidewall, may be covered with a dielectric which separates respectively the gate electrode and the shield plate from the sidewall. Hereinafter the dielectric in the first part is referred to as the gate dielectric 114 and the dielectric in the lower part referred to as the shield dielectric 113. As shown, the dielectric is along the surface of the sidewall in contact with respectively the body 122 and the drift regions 121,123. The dielectric is thicker in the first part than in the lower part. Thus, the gate electrode is sufficiently coupled in order to generate the channel whereas the shield plate is less coupled to the drift region, to enable creating the accumulation layer and the reduction of the electrical field density. In the shown example the gate dielectrics 114 and the shield dielectrics 113 are of the same material, e.g. silicon oxide. However, depending on the specific implementation, the dielectrics may be of different materials. Although in FIGS. 2-7 the dielectrics 113,114 are shown as a single vertical dielectric layer, it will be apparent that the dielectric may comprise a stack of two or more vertical layers.

Furthermore, the gate electrode, and if present shield plate(s), filling parts of the vertical trench 110 may be implemented in any manner suitable for the specific implementation and have any suitable shape, size and configuration. FIGS. 25-31 show several examples of filling the vertical trench, and shapes of the gate electrodes and the shield plate(s) if present.

In FIG. 25, for instance, the vertical trench does not have a shield plate. The gate electrode 111 consists of a single body with a top-portion 1110, extending vertically along the body 122 in the first part of the trench, and a bottom portion 1111 extending vertically along the first drift region 121 in the lower part of the trench. As shown, the vertical trench has a uniform lateral width and the top-portion 1110 is significantly thicker than the lower portion 1111. The dielectric is significantly thicker in the lower part of the trench than in the first part of the trench 100.

In FIG. 26, in addition to the elements in FIG. 25, the gate electrode comprises an extension 1112 extending from the top portion 1110 upwards towards the top layer of the stack, along the second drift region 121 in the upper part of the trench. As shown, the top-portion 1110 is significantly thicker than the lower portion 1111. The dielectric is significantly thicker in the upper part of the trench than in the first part of the trench 100.

In FIG. 27, for instance, the vertical trench has in addition to the gate electrode a lower shield plate. The gate electrode 111 consists of a single body of uniform thickness, extending vertically along the body 122 in the first part of the trench. The bottom part of the gate electrode 111 has a concave shape, which receives the top of the shield plate. This allows an enhancement of performance of the shield plate 112 and additionally reduces the parasitic capacitance between the gate electrode and the first current terminal. The shield plate 112 extends vertically along the first drift region 121 in the lower part of the trench. As shown, the vertical trench has a uniform lateral width and the gate electrode is significantly thicker than the shield plate. The dielectric is significantly thicker in the lower part of the trench than in the first part of the trench 100.

In FIG. 28, in addition to the elements in FIG. 26, the trench comprises an upper shield plate 118 of similar shape as the lower field plate 112, in this example slightly shorter. The upper shield plate 118 extends from the first part of the trench upwards towards the top layer of the stack, along the second drift region 123 in the upper part of the trench. As shown, the top part of the gate electrode has a concave shape as well which accommodates the bottom of the upper shield electrode. The concave top allows an enhancement of performance of the shield plate 118 and additionally reduces the parasitic capacitance between the gate electrode and the second current terminal.

Figure 29:
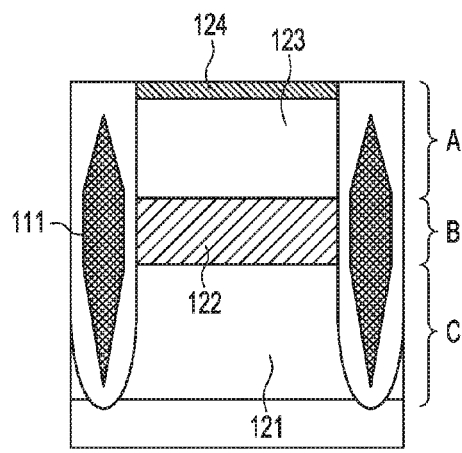
Figure 30:
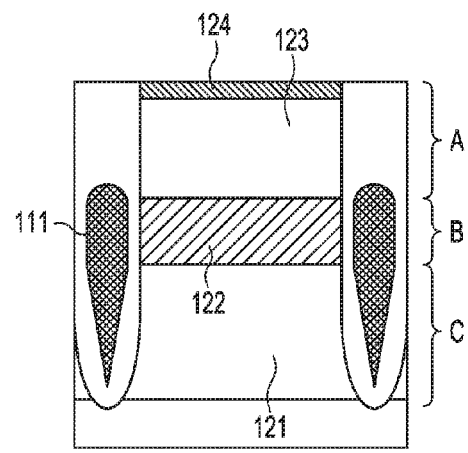

In the example of FIG. 29, the vertical trench is filled with a gate electrode which has a middle portion, extending vertically along the body 122, of a uniform thickness and upper and lower portions with a tapered shape pointing and extending respectively upwards along the second drift region 123, and downwards along the first drift region 121. It is found that such a shape can effectively increase gradually (i.e. as a function of vertical depth) the lateral isolation of the drift regions 121,123 and allows to increase the breakdown voltage. In the example of FIG. 30, the gate electrode has a similar shape but without the upper portion and the top of the gate electrode is convex or rounded off, which reduces the risk of locally too dense electrical fields, as well as the parasitic capacitance between the gate electrode and the second current terminal or the first current terminal (depending on the bias direction).

Figure 31:
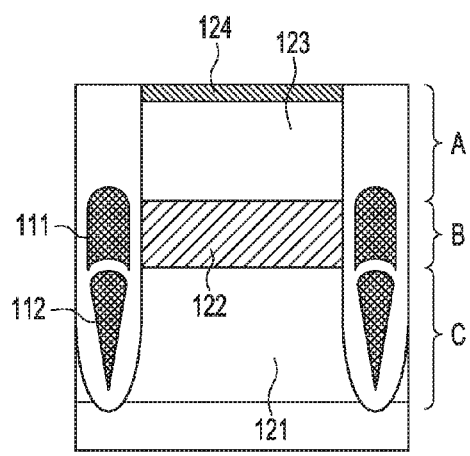

In FIG. 31, the trench 100 comprises a gate electrode 111 and a shield plate 112. The shield plate has in the vertical direction a tapered shape pointing towards the substrate 101. The gate electrode has a uniform width with a concave bottom which receives a convex top of the shield plate, and a convex top.

The first drift region 121 and the second drift region 123 may be implemented in any manner suitable for the specific implementation. The first and second drift region can be of a first conductivity type having a first type of majority charge carriers, while the body is of a second conductivity type having a second type of majority charge carriers opposite to the first type. For example the drift regions may be n-type semiconductors.

In the example of FIGS. 2-7, the first drift region 121 extends in lateral direction between the vertical trenches and is defined by the inner sidewalls of the vertical trenches. The first drift region 121 extends in vertical direction from the top-surface of the substrate 120 until the bottom of the body 122. Suitable lower limits for the thickness have been found to 2 micron or more, such as 5 micron or more, for example 10 micron or more, and suitable upper limits 10 micron or less, such as 5 micron or less, such as 2 micron or less. The drift region may for example be mono-crystalline, and grown on the substrate through for instance an epitaxial process. The drift region may be of the same material, e.g. Si, as the first current terminal 120 but with a lower doping concentration. A suitable dopant has found to be P or As with a resistivity of 0.2 Ohm*cm or more, e.g. 0.5 Ohm*cm or more, such as 0.8 ohm*cm or more. A suitable upper limit has been found a resistivity of 1 Ohm*cm or less. A particularly effective resistivity has been found to be 0.4 Ohm*cm on average. The resistivity may vary in the first drift region 121, for example as a function of depth, in a manner suitable to increase the breakdown voltage of the power transistor, as e.g. shown in FIG. 32. The first drift region may for example be provided with a linearly graded doping to obtain a suitable resistivity variation.

The second drift region 123 may, as in the examples, have essentially the same characteristics as the first drift region 121. In the example, the thickness of the second drift region is much less than of the first drift region. A suitable thickness has found to be 1 micron or more, for example 1.5 micron.

The first current terminal 120 and second current terminal 124 may be implemented in any manner suitable for the specific implementation. In the shown examples, the first and second current terminal 120, 124 are of the same, first, conductivity type as the drift regions 121,123 and opposite to the conductivity type of the body 122. The concentration of majority charge carriers in the first current terminal 120 is higher than in the first drift region 121. The concentration of majority charge carriers in the second current terminal 124 is higher than in the second drift region 123, as can be seen in FIG. 31 for the example of FIGS. 2-7. The current terminals 120,124 may for example be doped or otherwise be provided with a resistivity which is at least one order of magnitude smaller than the resistivity of the drift regions 121,123.

In the example of FIGS. 2-7, the first current terminal 120 is formed by the substrate 101. On the bottom of the substrate, also referred to as the back-side, a metal layer 129 is provided which constitutes the electrode for the first current terminal 120 and allows to connect the first current terminal 120 to an external voltage or current supply. In this example, the substrate 101 is of a semiconductor material provided with a dopant of the same type as the first drift region 211 (e.g. an n-type doping or a p-type doping) to make the first current terminal 120 highly conductive compared to the drift region 121. For instance, the doping concentration may be at least 2.5 orders of magnitude higher than in the drift region, 3 orders or more have been found to be particularly effective, as illustrated in FIG. 31. The substrate 101 may be any suitable type of substrate such as a mono-crystalline Si substrate with a <100> orientation, and doped with a suitable dopant, such as in case of an N-doped current terminal Arsenic (As), to obtain a resistivity of less than 1 milli Ohm/com, such as less than 0.005 ohm/cm, for example 0.03 Ohm*cm or less.

The second current terminal may be implemented in any manner suitable for the specific implementation, and be of similar constitution as the first current terminal, but in terms of conductivity and doping concentration different, for example with a doping concentration which is an order of magnitude higher, as illustrated in FIG. 31. In this example, the second current terminal is formed as the area of the top layer 1020 of the layer stack 102, defined in lateral direction by the inner sidewalls of the trenches 110 and in vertical direction by the top of the body 122 and the top-surface 1020 of the layer stack. However, depending on the specific implementation the second current terminal 124 may be implemented above the top layer 1020, for example by local formation or deposition of a suitable material on the layer stack, in the area in lateral direction between the inner sidewalls of the vertical trenches 110.

The body may be implemented in any manner suitable for the specific implementation. In the shown example, the body is defined in lateral direction by the inner sidewalls of the vertical trenches 110 and in vertical direction between by the bottom of the second drift region, and the top of the first drift region. The body may for example be formed by a doping a semiconductor material, e.g. Si, with a suitable dopant. A suitable dopant has been found Boron, such as $B_{11}$. As illustrated in FIG. 31, a suitable concentration has been found to be 2 orders of magnitude smaller than that of the first current terminal 120.

Figure 32:
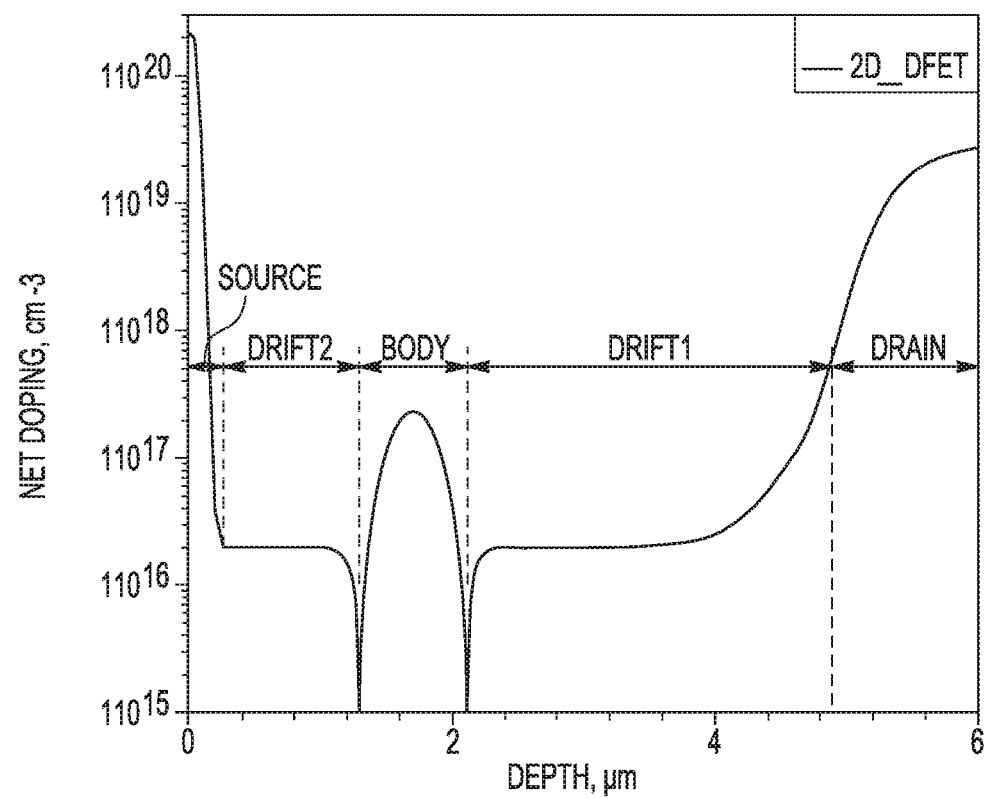
FIG. 32 is a graph of net doping concentration as a function of depth at equidistance from the inner sidewalls of the vertical trenches in the example of FIGS. 1-7.

FIG. 32 shows a suitable net doping profile for the example of FIG. 1. In FIG. 32, the net doping is defined as $N_{net}=|N_D-N_A|$, where $N_D$ is the concentration of donors, and $N_A$ the concentration of acceptors. As shown, the doping in each part, e.g. body, drift region, current terminal, is profiled, with a maximum and gradually falling towards the bottom or top of the respective part, due to the implantation process, and where the concentration referred to in the above, the maximum of the profile in the part of the power transistor 100 is meant.

The layer stack may be implemented in any manner suitable for the specific implementation. In the shown example, the layers stack 102 comprises a bulk layer of a base material of the first conductivity type with a concentration of majority charge carriers equal to a concentration in the first drift region or in the second drift region. The bulk layer is provided with one or more doped layer in which a doping is different than in the base material. The doped layer having the second conductivity type and/or concentration of majority charge carriers higher than the base material. Thus, in the example the layers of the layer stack 102 are formed from the same base material. However, alternatively the layer stack may comprise a plurality of different layers of different base materials, for example individually grown on top of each other during consecutive phases of manufacturing of the power transistor.

The doped layers in the bulk layer may for example comprise one or more of the group consisting of:

a buried layer of the second conductivity type, in which the body is present;

a source layer of the first conductivity type with a concentration of majority charge carriers higher than the base material, in which the second current terminal is present, the source layer is separated from the buried layer by a drift layer of the base material which the second drift region is present;

a drain layer of the first conductivity type with a concentration of majority charge carriers higher than the base material, in which the first current terminal is present, the drain layer is separated from the buried layer by a drift layer of the base material in which the first drift region is present.

The power transistor may be used to control the flow of current. The shown example of power transistor may for example be used in a method for operating a power transistor as described below, although it will be apparent that other types of bi-directional power transistors may be used as well to perform such a method and that the power transistor may be used in other methods. The power transistor can be operated intermittently in a first direction or a second direction, i.e. bi-directional. The bi-directional nature of the power transistor 100 will now be described in operation, using the example of a n-type power transistor.

In a first direction and in respect of switching the power transistor 100 on, a positive voltage may be applied to the drain contact 129. The body electrode may be connected to the source electrode, so as to electrically couple the body 122 to the source 124. To the shield plate a positive bias voltage sufficient to generate an accumulation layer in the first drift region may then be provided.

A positive gate bias voltage, $V_{gs}>0V$, may be applied on the gate feed 105 by an external gate driver circuit (not shown) causing a depletion field effect through the gate dielectric into a region of the body 122 that contacts the first and second trenches 110. When the gate bias voltage exceeds a threshold voltage $V_{th}$, an inversion conducting n-layer may be formed along the interface of the trench and the body, which conducts the majority of carriers injected from the source to be collected by the drain.

In an off-state, a positive voltage may be applied to the drain. The body may still be electrically tied to the source and so be subjected to a source potential. The gate bias voltage may be set to a lowest potential, namely $V_{gs}=0V$. A first depletion layer may be formed around a bottom p-n junction formed by the interface of the body 108 and the first drift region 121. By increasing the drain-source bias voltage, $V_{ds}$, a first space charge region of the depletion layer may increase to the low-doped bottom part of the first drift region 121. The electrical field in the region thereby increases and when a breakdown voltage is reached, an avalanche phenomena by carrier impact ionization may be observed causing breakdown of the reverse biased junction mentioned above.

In the second direction, a negative bias voltage may be provided to the shield plate. This reduces the electrical field density in at least a part of the first drift region, and accordingly the breakdown voltage can be increased.

In the second direction and in relation to an on-state, the body switch may be set such that the drain potential is coupled to the body 122. A positive voltage may be applied to the source 124. The positive gate bias voltage, $V_{gs}>0V$, may be applied to the gate by the external gate driver circuit, thereby causing a depletion field effect through the gate dielectric into the body along the inner sidewalls of the trenches 110. When the gate bias voltage exceeds the threshold voltage $V_{th}$ an inversion conducting layer may be formed along the interface of the trench dielectric and the body, which may conduct the majority of the carriers injected from the substrate 102 and collected by the source 124.

In an off state, a positive voltage may be applied to the source. The body may still be electrically tied to the potential of the drain. The gate bias voltage, $V_{gs}$, may be set to the lowest potential, namely, $V_{gs}$=0V. A second depletion layer may be formed around a top p-n junction formed by the interface of the body and the second drift region 123. By increasing the drain-source bias voltage, $V_{ds}$, a second space charge region of the depletion layer may increase to the low-doped top part of second drift region. The electrical field in the region may thereby increase and when a breakdown voltage is reached, an avalanche phenomena by carrier impact ionization may be observed causing breakdown of the reverse biased junction mentioned above, thereby implementing the blocking voltage.

The power transistor may be manufactured in any manner suitable for the specific implementation. For example, on a substrate 101 a layer stack 102 extending over the substrate may be provided. The layer stack may be provided with a first vertical trench 110 and a second vertical trench 110, each of the vertical trenches extending in a vertical direction from a top layer of the stack towards the substrate. A second current terminal 124 may be provided on or above the top layer and a first current terminal 120, in the vertical direction, below the second current terminal. An electrical path may be provided between the first current terminal and the second current terminal which can be selectively enabled or disabled to allow current to flow. The electrical path may be provided to comprise a body 122 which extends vertically between the first current terminal and the second current terminal, and laterally between the first and second vertical trenches. A first drift region 121, in the vertical direction, between the body and the first current terminal may be provided, as well as a second drift region 123, in the vertical direction, between the body and the second current terminal.

Each of the first and second vertical trenches 110 may be provided in an first part of the vertical trench with a gate electrode 112 which is electrically coupled to the body 122. The trenches 110 may be provided in a lower part of the trench closer to the substrate 101 than the first part with a lower shield plate 112. At least a body-side vertical sidewall of each of the vertical trenches may be provided with a dielectric which separates the gate electrode and the shield plate from the body-side vertical sidewall, the dielectric is thicker in the first part than in the lower part.

Figure 8:
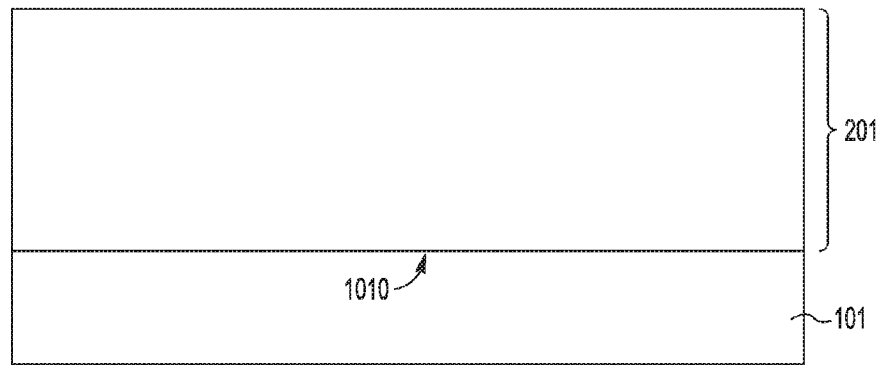
FIGS. 8 to 24 are sectional views of a power transistor in successive stages of a method of manufacturing thereof.

The example of FIGS. 1-7, may for example be manufactured as follows. Initially, referring to FIG. 8, the power transistor 100 may comprise a substrate 101. In case of an n-type power transistor, the substrate 101 may be strongly doped with an N-type dopant, such as Arsenic. A suitable substrate material is found to be mono-crystalline Silicon with a <100> orientation for example. However other substrate types may be used as well.

On the top surface 1010 of the substrate, a layer stack may be manufactured in any suitable manner. For example, a bulk layer 201 may be provided, e.g. by epitaxial growth, extending over the top-surface 1010 and directly adjacent thereto. The bulk layer 201 may be monolithic, and for example of the same material as the substrate, i.e. <100> Si. However the bulk layer or substrate may alternatively be of a different material, such as SiC or GaN. The substrate may be a single material, e.g. Si, or be an engineered substrate consisting of multiple, initially unpatterned layers layered one on top of the other. In the shown example the bulk layer 201 has about the thickness of the layer stack 102, e.g. 5 micron, and subsequently several layers are created by modifying the characteristics of the bulk layer at different depth, e.g. through suitable doping implant and activation. However, alternatively the bulk layer may be thinner than the layer stack and serve as a bottom layer thereof, with the additional layers of the layer stack being created by growth on the bulk layer, e.g. of an oppositely doped epitaxial layer for the body, and on top of the oppositely doped epitaxial layer another epitaxial layer for the second drift region 123.

Figure 9:
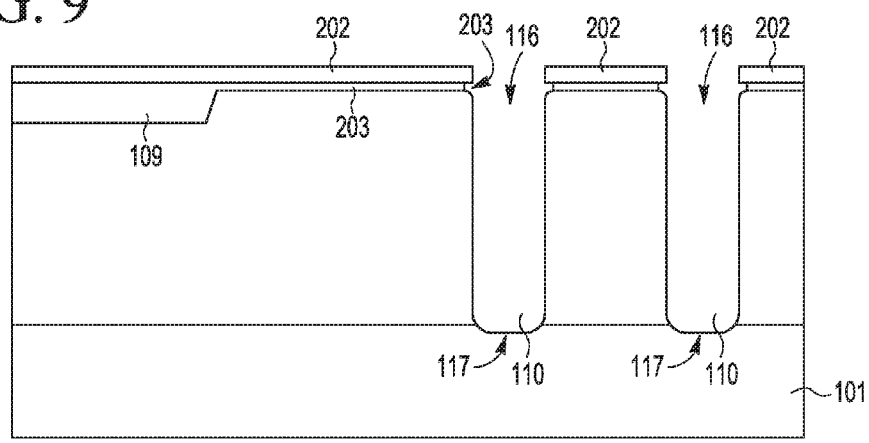

Referring to FIG. 9, the bulk layer may be provided on the, exposed top-surface with a pad layers, in this example a thin layer of a pad oxide 202 and a thicker layer of pad nitride 203 on top of the pad oxide layer 202, and locally be provided with the STI 109.

Vertical trenches 110 may be etched in the bulk layer 201. For example, over the pad layers a hard mask may be deposited, e.g. a tetraethyl orthosilicate (TEOS) hardmask, after which the hardmask and pad-layers are locally etched to expose the top surface of the bulk layer in the areas where the trenches are to be provided. The bulk layer 201 may then be etched to the desired depth of the trenches 110. In this example the bulk layer 201 is etched until the substrate layer 101 and the substrate itself is slightly etched. For example, etching may remove in vertical direction from the top-surface of the bulk layer, between 0.1 and 0.5 micron more than the thickness of the bulk layer i.e. into the substrate 101. As illustrated in FIG. 9, the resulting trenches extend from a trench top 116 into the bulk layer, and in this example beyond the bulk layer into the substrate 101, to a trench bottom 117. The trench bottom 117 may be rounded, for example by first etching the trench and a subsequent rounding. The subsequent rounding may for example be obtained by depositing on the walls of the trench a sacrificial layer, e.g. Silicon-oxide, of a suitable thickness, e.g. several hundred, such as 800, Angstrom, and subsequently over etching the sacrificial layer, e.g. several hundred Angstrom more than the thickness of the sacrificial layer.

Figure 10:
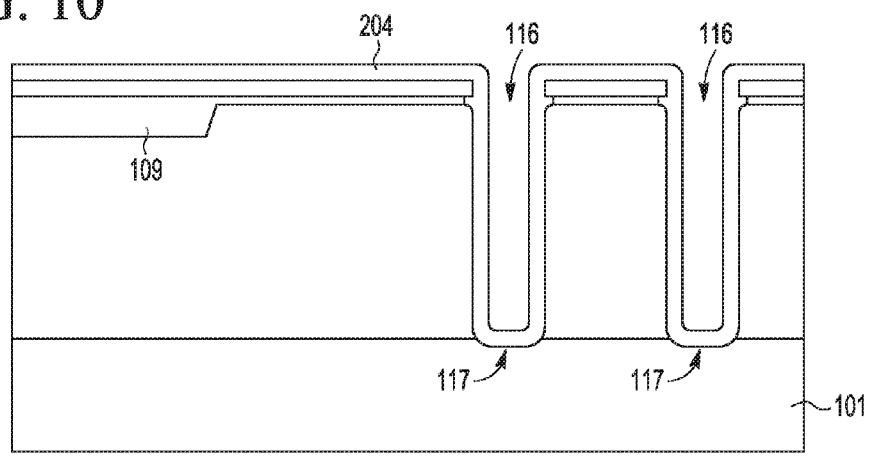

Referring to FIG. 10, after the shape of the trenches has been defined by the etching, the walls of the trenches may be provided with a lining dielectric, e.g. silicon oxide, of a suitable thickness, e.g. several hundred, such as 700, Angstrom. In the shown example, the dielectric is a continues lining layer 204 formed by depositing a lateral dielectric layer, e.g. silicon-oxide, which fills the bottom of the trench, over the exposed lateral surfaces of the intermediate product, and oxidizing the vertical sidewall to obtain a dielectric layer of 700 Angstrom.

Figure 11:
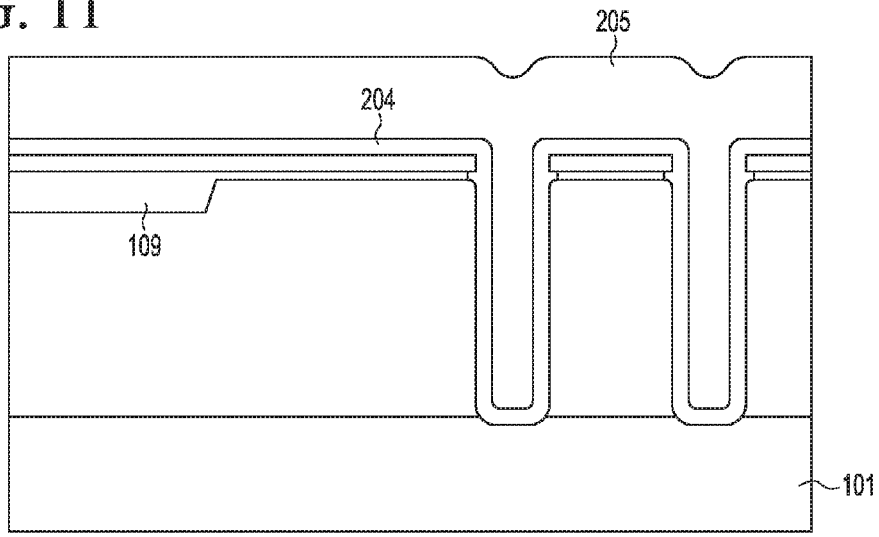
Figure 12:
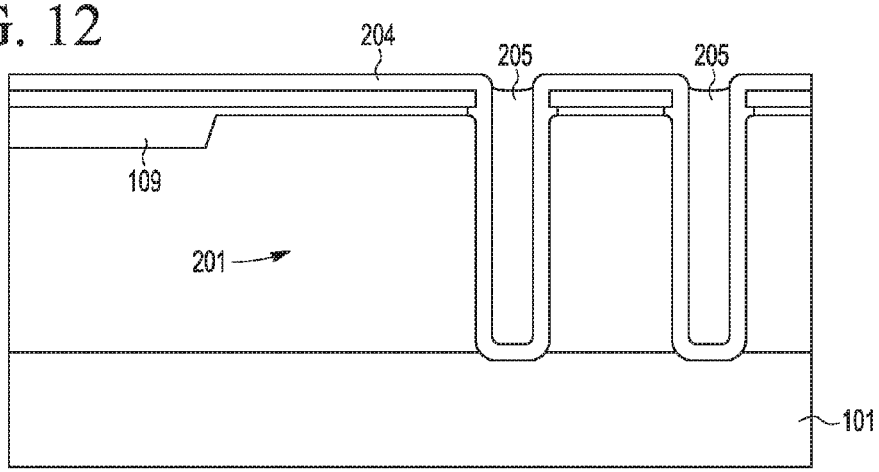
Figure 13:
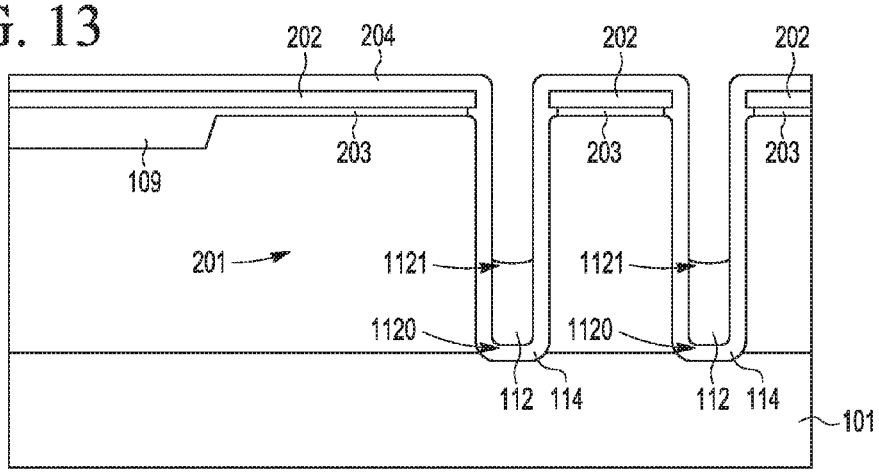
Figure 14:
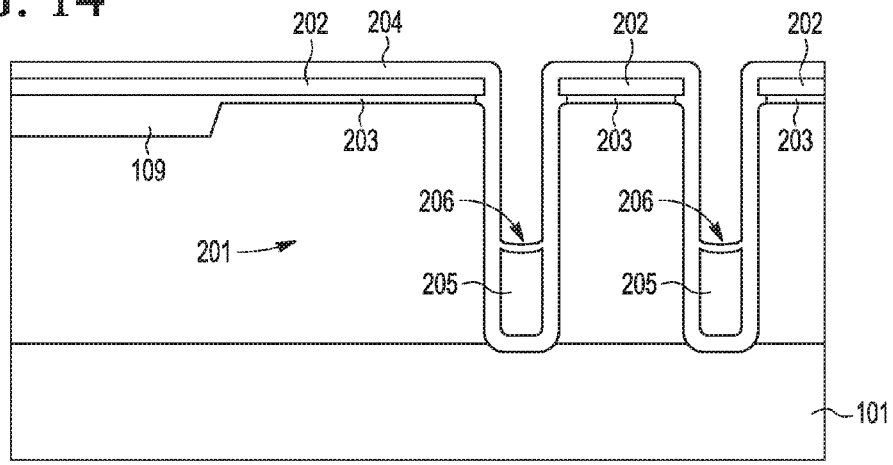
Figure 15:
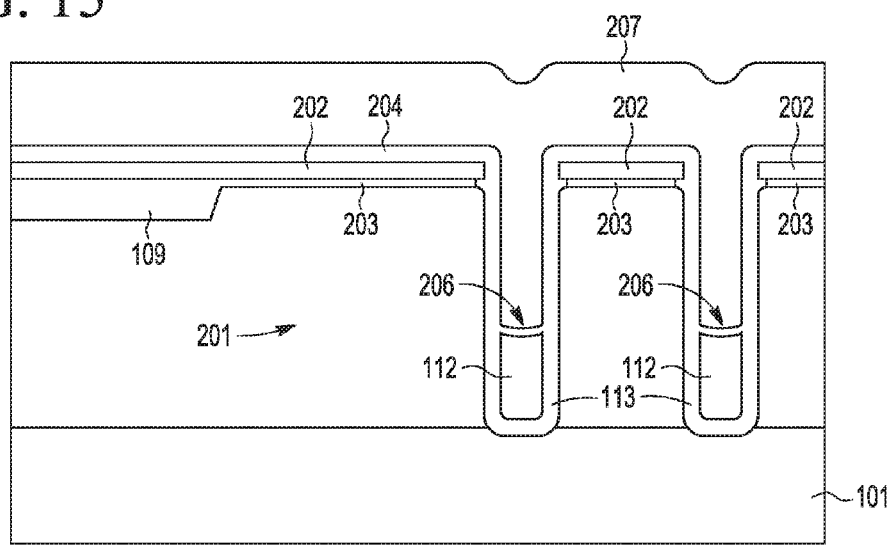

Referring to FIGS. 11-13, after the lining is formed the shield plate (if present) may be formed. The shield plate may for example be formed by filling the trenches with a suitable electrode material, such as doped polysilicon or a metal. A suitable electrode material has found to be polysilicon doped with phosphor at a concentration of $1\cdot10^{20}$ atoms per cubic centimeter ($at/cm^3$). In the shown example, a thick blanket layer 205 of polysilicon with a suitable dopant, is deposited, for example using Low-Pressure Chemical Vapor Deposition, over the exposed surfaces. The blanket layer is sufficiently thick to completely fill the trenches, as shown in FIG. 11. Referring to FIG. 12, the blanket layer is then reduced in thickness until the directly underlying lateral surface is exposed. For example the blanket layer 205 may be planarized, e.g. by chemical-mechanical planarization (CMP) down to a hardmask, e.g. a TEOS hardmask, on which the blanket layer is deposited. Referring to FIG. 13, the final shield plate may then be obtained by further removing, e.g. through etching, the remaining parts of the layer 205 until the desired height of the shield plate 112. As shown in FIG. 13 the resulting plate structure 112 extends between a plate top 1121 and a plate bottom 1120. The plate bottom 1120 is slightly above the substrate 101 and separated from the substrate by the dielectric in the bottom 117 of the trench 110.

Figure 16:
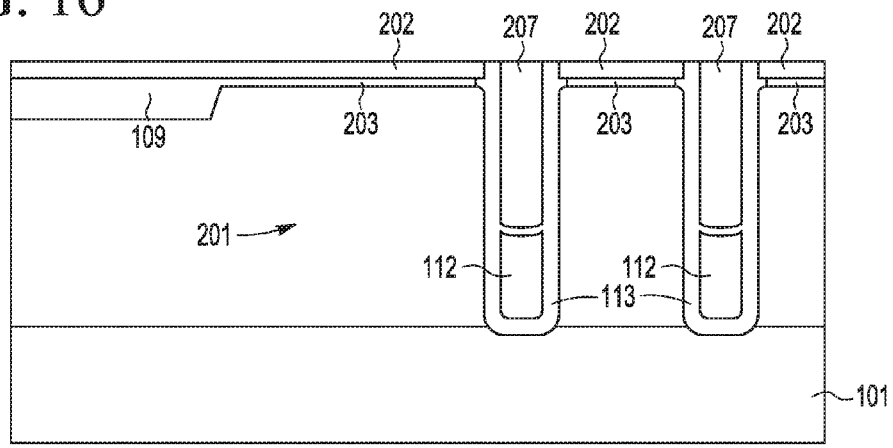
Figure 17:
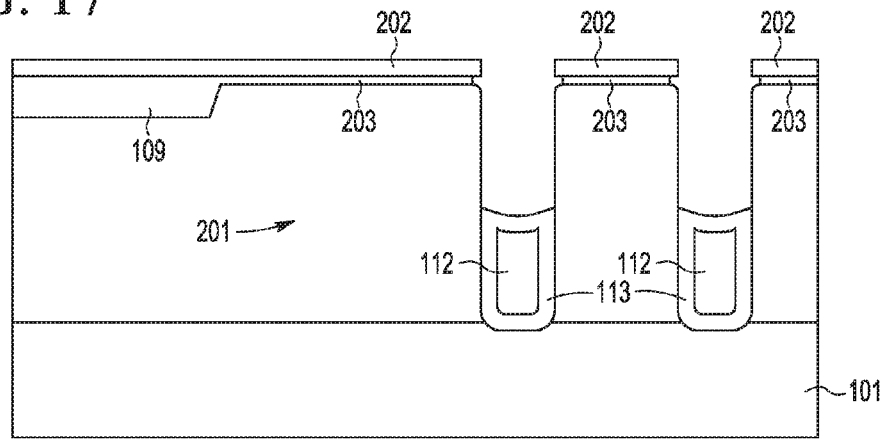
Figure 18:
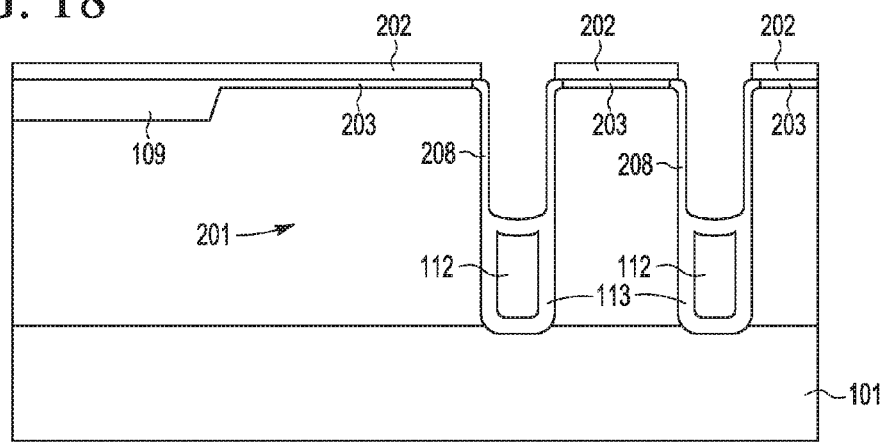
Figure 24:
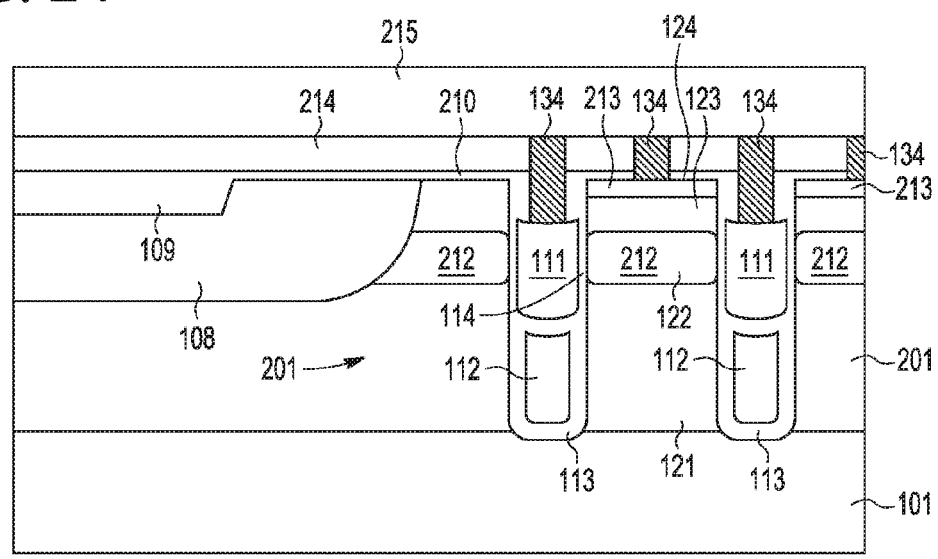

Referring to FIGS. 14-17, in case the power transistor is to be provided with a shield plate an intermediate dielectric layer 206 may be provided in the trench 110 on the plate top 1121, which serves to separate the shield plate 112 from the gate electrode 114. However, this may be omitted in order to obtain a gate electrode extending vertically along the first drift region, e.g. with a shape as shown in FIG. 24 or 25. The formation of the intermediate dielectric may for example comprise re-oxidizing the plate top 1121 after additional etching of the plate top 1121 to obtain a rounded, e.g. convex or concave, plate top 1121, with a re-oxidized top surface 206 as show in FIG. 14. After that, a blanket dielectric layer 207 may be deposited which covers the exposed lateral surface of the layer stack and fills the trenches up to the re-oxidized top surface 206, see FIG. 15. The blanket dielectric layer 207 may subsequently be removed outside the trenches, as shown in FIG. 16 and reduced in thickness in the trenches to obtain the desired intermediate dielectric thickness. A suitable material for the intermediate dielectric has found to be TEOS. For instance, a TEOS layer may be deposited as blanket dielectric layer 207, e.g. in this example on the pad nitride layer 203. The TEOS layer may then be planarized, e.g. through CMP or otherwise, down to the pad nitride layer 203. The TEOS layer may then be etched in the trenches until the desired depth Referring to FIGS. 18-21, after the intermediate dielectric is formed if trench is to be provided with a shield plate, the gate electrode may be formed. In this example, a thin gate dielectric layer 208 is then formed on the vertical sidewalls of the trenches in the not filled parts thereof, i.e. between the intermediate dielectric and the top of the trench, as shown in FIG. 18. For example a silicon oxide layer of several hundred Angstrom, e.g. a thermal silicon oxide of 700 Angstrom, may be provided to form the vertical gate dielectric. After that the actual gate electrode may be formed.

Figure 19:
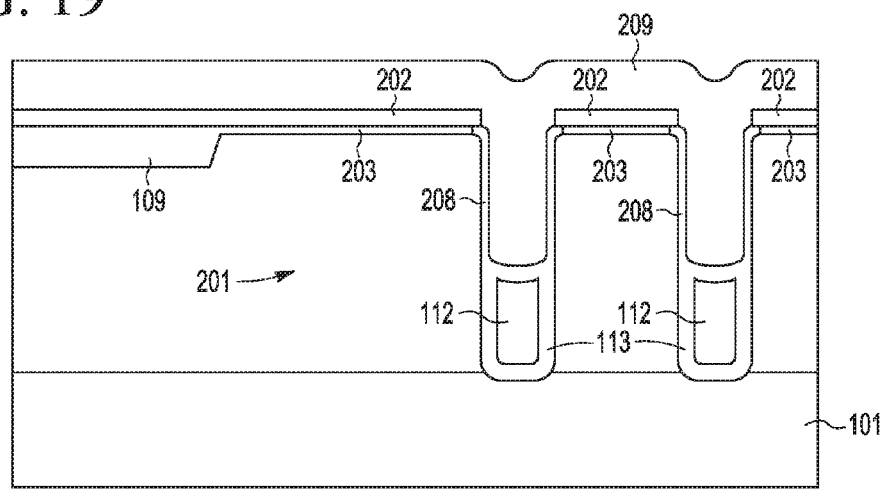
Figure 20:
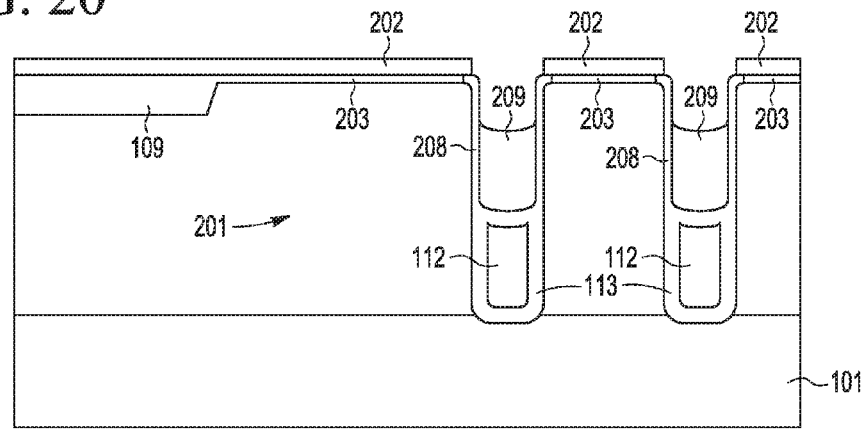

Referring to FIG. 19, the gate electrode may for example be formed by filling the trenches with a suitable electrode material, such as doped polysilicon or a metal. A suitable electrode material has found to be polysilicon doped with phosphor at a concentration of $1 \cdot 10^{20}$ at/cm$^3$. In the shown example, a thick blanket layer 209 of polysilicon with a suitable dopant is deposited, for example using Low-Pressure Chemical Vapor Deposition, over the exposed surfaces. The blanket layer 209 is sufficiently thick to completely fill the trenches from the intermediate dielectric, as shown in FIG. 19. The blanket layer 209 is then reduced in thickness until the directly underlying lateral surface is exposed. For example the blanket layer 209 may be planarized, e.g. by chemical-mechanical planarization (CMP) down to the top-surface of the top nitride layer 203, on which the blanket layer 209 is deposited. Referring to FIG. 20, the final shield plate may then be obtained by further removing, e.g. through etching, the remaining parts of the layer 209 until the desired height of the gate electrode 114. In this example, the gate electrode extends from the intermediate dielectric until 1 micron or less, e.g. 0.9 micron, below the top surface of the bulk layer 201.

Figure 21:
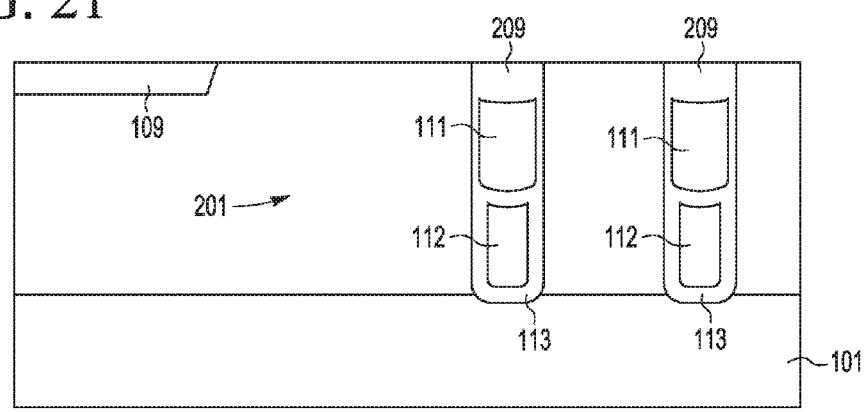

Referring to FIG. 21, the exposed top of the gate electrode may then be covered with a top dielectric, for example by filling the rest of the trench 110 with a suitable dielectric. For instance, a thin layer, e.g. 400 Angstrom, may be grown on the exposed top, for example of thermal silicon oxide, which is subsequently covered with another dielectric. The other dielectric may for example be deposited as a blanked layer covering the exposed lateral surfaces of the intermediate product, which subsequently is reduced in thickness down to the top-surface of the bulk layer 201 9 hence removing the top nitride and top oxide layers 203,203), e.g. a TEOS layer which subsequently is planarized, e.g. by CMP.

Figure 22:
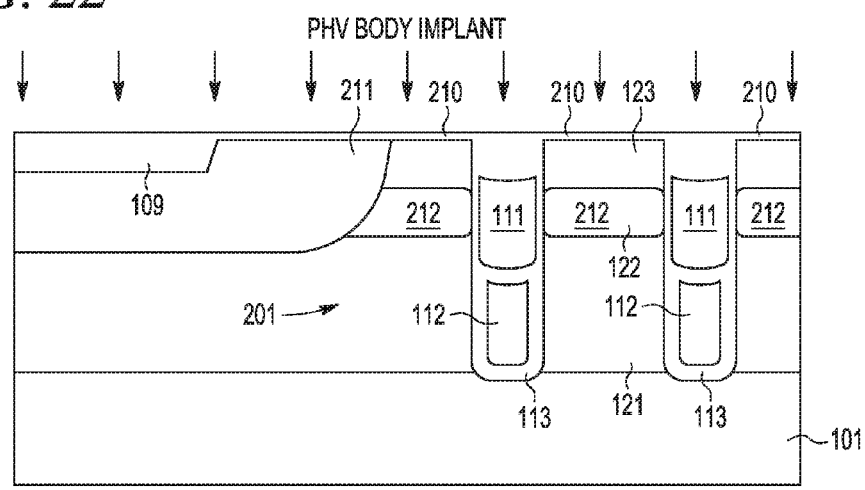

Referring to FIG. 22, after forming the gate electrode and hence finalizing the vertical trenches 110, the body may be formed. It will be apparent though that in an alternative embodiment the body and/or drift regions and/or current terminals may be formed before forming the trenches or before filling the trenches. In this example, the body is formed by implanting a dopant layer 212 at a convenient depth and subsequent activation of the dopant. For example, in case of a n-type transistor, implantation and activation of a p-type dopant, e.g. Boron, such as $B_{11}$, may be performed. For instance, a dose of $2 \cdot 10^{13}$ at/cm$^3$ implanted with 700 kEV energies may be provided and activated by a furnace anneal. As shown in FIG. 22, locally a well 211 of same conductivity type as the body may be formed, e.g. by local implant of a dopant. For instance in case of a n-type transistor, implantation and activation of a p-type dopant, e.g. Boron, such as $B_{11}$, may be performed. For instance, successive doses of $2 \cdot 10^{13}$ atoms per square cm (at/cm$^2$), $1 \cdot 10^{13}$ at/cm$^2$, $1 \cdot 10^{13}$ at/cm$^2$, $6 \cdot 10^{12}$ at/cm$^2$ may be implanted with respectively 30 keV, 140 keV, 250 keV, 1 MeV energies and activated by a furnace anneal. The concentration in at/cm$^2$ being measured parallel to the top-surface 130. Prior to the doping implant, a sacrificial layer 210 of e.g. 400 Angstrom silicon oxide may be deposited on top of the bulk layer to protect the bulk layer during doping implantation, e.g. from low energy debris that comes along with the implant.

Figure 23:
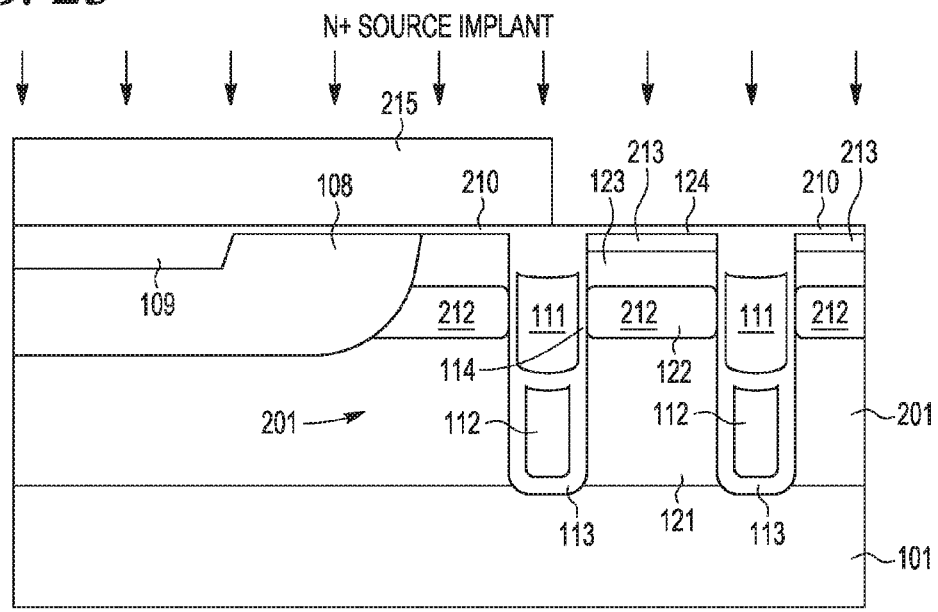

Referring to FIG. 23, the second current terminal may be formed by implanting a dopant layer 213 at a convenient depth and subsequent activation. For example, in case of a n-type transistor, implantation and activation of an n-type dopant, e.g. As, may be performed. For instance, an dose of $7 \cdot 10^{15}$ at/cm$^2$, with 80 kEV implant energy may be provided under an angle of 0.5 degrees from the vertical and activated by a furnace anneal. As shown in FIG. 23, to protect the areas where the layer 213 should not be present, a blocking layer 215, for example of Co$_4$N, may be provided on the exposed top surface of the layer stack.

Referring to FIG. 24, after forming trenches, the body, the drift regions and current terminals, suitable contacts may be provided and the power transistor be finalized. E.g. an interlayer dielectric layer 214 may be provided, such as a TEOS layer, in which openings are provided where vias are formed that connect to the gate electrode, body, current terminals etc. and one of more interconnect layers provided on the interlayer dielectric layer 214 that are connected to respective parts of the power transistor through suitable vias 131. It will be apparent that after finalizing the power transistor, on the same die other structures may be provided and that the die may be packaged in a package suitable to support the currents and voltages the power transistor is designed for, In the foregoing description, the invention has been described with reference to specific examples of embodiments of the invention. It will, however, be evident that various modifications and changes may be made therein without departing from the scope of the invention as set forth in the appended claims, and that the claims are not limited to the specific examples given in the foregoing description. Of course, the above advantages are examples, and these or other advantages may be achieved by the examples set forth herein. Further, the skilled person will appreciate that not all advantages stated above are necessarily achieved by embodiments described herein.

For example, the semiconductor substrate described herein can be any suitable semiconductor material or combinations of materials, such as gallium arsenide, silicon germanium, silicon-on-insulator (SOI), silicon, monocrystalline silicon, the like, and combinations of the above. Likewise, the semiconductor substrate described herein is a mono-layer but the semiconductor substrate may also be an, unpatterned, engineered substrate consisting of several layers of different materials.

Also, some of the figures are discussed in the context of a device with a n-type transistor. However, embodiments according to the present invention are not so limited. That is, the features described herein can be utilized in a p-type transistor. The discussion of an n-channel device can be readily mapped to a p-channel device by substituting p-type dopant and materials for corresponding n-type dopant and materials, and vice versa. Likewise, although specific dopants (As,B,P) have been mentioned, it should be apparent that other dopants may be suitable as well. Furthermore, although in the examples shown, the layer stack is formed from Si, other materials may be suitable as well.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Other modifications, variations and alternatives to the examples set forth herein are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases one or more or at least one and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A bi-directional trench field effect power transistor, comprising:
   a substrate with a substrate top surface;
   a layer stack extending over the substrate top surface, a first vertical trench and a second vertical trench being present in the layer stack, each of said first and second vertical trenches extending in a vertical direction from a top layer of the layer stack towards the substrate;
   a first current terminal and a second current terminal, the first current terminal being situated in said vertical direction below the second current terminal and the second current terminal being situated on or above the top layer; and
   an electrical path which can be selectively enabled or disabled to allow current to flow in a first direction or a second direction, opposite to the first direction, between the first current terminal and the second current terminal, the electrical path comprising:
      a body extending laterally between the first and second vertical trenches and vertically between said first current terminal and said second current terminal;
      a first drift region extending, in said vertical direction, between the body and the first current terminal;
      a second drift region extending, in said vertical direction, between the body and the second current terminal;
   wherein the first vertical trench and the second vertical trench have the same of option (a) and/or (b);
   option (a) being:
      the first and second vertical trenches extend, in said vertical direction, from said top layer beyond an upper boundary of the first drift region, and in a lateral direction parallel to the substrate top-surface electrically isolate, and define, the first drift region;
   option (b) being: each of said first and second vertical trenches comprising:
      a gate electrode in an first part of the vertical trench, the gate electrode being electrically coupled to the body, for forming, when a suitable voltage is applied to the gate, a vertical channel in the body through which a current can flow from the first drift region to the second drift region or vice versa;
      a lower shield plate, the shield plate being situated in a lower part of the trench, the lower part being closer to the substrate than the first part, for generating an accumulation layer in the first drift region when the lower shield plate is biased with respect to the first current terminal in a first polarity and locally reducing the electrical field density when the lower shield plate is biased with respect to the first current terminal in a second polarity; and
      a body-side vertical sidewall, and another vertical sidewall facing the body-side vertical sidewall, of which at least the body-side vertical sidewall is covered with a dielectric which separates the gate electrode and the shield plate from the body-side vertical sidewall, the dielectric being thicker in the first part than in the lower part.

2. A power transistor as claimed in claim 1, wherein the first and second vertical trenches each further comprise an upper shield plate for generating an accumulation layer in the second drift region when the upper shield plate is biased with respect to the second current terminal in the first polarity and reducing at least locally the electrical field density when the upper shield plate is biased with respect to the second current terminal in the second polarity.

3. A power transistor as claimed in claim 1, wherein the lower shield plate has in said vertical direction a tapered shape pointing towards the substrate.

4. A power transistor as claimed in claim 1, wherein the first and second vertical trenches extend from the top layer at least until the substrate top surface.

5. A power transistor as claimed in claim 4, wherein the vertical trenches extend into the substrate and the shield plate terminates above the substrate.

6. A power transistor as claimed in claim 1, having a current maximum of at least 2 A and/or a positive drain-source break down voltage of at least 45 V and a negative drain-source break down voltage of at least 25 V.

7. A power transistor as claimed in claim 1, comprising separate contacts connected to individually control the voltage and/or current of the gate electrode, the first current terminal, the second current terminal, and the body.

8. A power transistor as claimed in claim 7, comprising further separate contacts connected to individually control the voltage of the lower shield plate and the upper shield plate.

9. A power transistor as claimed in claim 7, wherein the voltage of the lower shield plate and/or the upper shield plate is dependent on the voltage of the second current terminal and the lower shield plate and/or the upper shield plate are connected to the second current terminal.

10. A power transistor as claimed in claim 1, comprising an elongated vertical trench enclosure which, in a plane parallel to the substrate top-surface, encloses the electrical path, the first vertical trench and the second vertical trench being part of the elongated vertical trench enclosure.

11. A power transistor as claimed in claim 1, wherein the elongated vertical trench enclosure comprises an elongated enclosing gate electrode which comprises the gate electrodes of the vertical trenches, and an elongated enclosing lower shield plate which comprises the lower shield plates of the vertical trenches, the enclosing gate electrode enclosing the body and the enclosing lower shield plate enclosing the first drift region.

12. A power transistor as claimed in claim 1, wherein the first and second drift region are of a first conductivity type having a first type of majority charge carriers, and the body is of a second conductivity type having a second type of majority charge carriers opposite to the first type.

13. A power transistor as claimed in claim 12, wherein:
the first and second current terminals are of the first conductivity type;
the concentration of majority charge carriers in the first current terminal is higher than in the first drift region; and
the concentration of majority charge carriers in the second current terminal is higher than in the second drift region.

14. A power transistor as claimed in claim 1, wherein the layer stack comprises a bulk layer of a base material of the first conductivity type with a concentration of majority charge carriers equal to a concentration in the first drift region or in the second drift region, the bulk layer being provided with at least one doped layer in which a doping is different than in the base material, the doped layer having the second conductivity type and/or concentration of majority charge carriers higher than the base material.

15. A power transistor as claimed in claim 14, wherein the doped layers comprise one or more of the group consisting of:
a buried layer of the second conductivity type, in which the body is present,
a source layer of the first conductivity type with a concentration of majority charge carriers higher than the base material, in which the source layer the second current terminal is present, the source layer being separated from the buried layer by a drift layer of the base material which the second drift region is present; and
a drain layer of the first conductivity type with a concentration of majority charge carriers higher than the base material, in which the source layer the first current terminal is present, the source layer being separated from the buried layer by a drift layer of the base material in which the first drift region is present.

16. A power transistor as claimed in claim 1, wherein the substrate is of the first conductivity type, and the first current terminal is provided in the substrate.

17. A semiconductor product, comprising:
a plurality of power transistors, each of the power transistors comprising:
a substrate with a substrate top surface;
a layer stack extending over the substrate top surface, a first vertical trench and a second vertical trench being present in the layer stack, each of said first and second vertical trenches extending in a vertical direction from a top layer of the layer stack towards the substrate;
a first current terminal and a second current terminal, the first current terminal being situated in said vertical direction below the second current terminal and the second current terminal being situated on or above the top layer; and
an electrical path which can be selectively enabled or disabled to allow current to flow in a first direction or a second direction, opposite to the first direction, between the first current terminal and the second current terminal, the electrical path comprising:
a body extending laterally between the first and second vertical trenches and vertically between said first current terminal and said second current terminal;
a first drift region extending, in said vertical direction, between the body and the first current terminal;
a second drift region extending, in said vertical direction, between the body and the second current terminal;
wherein the first vertical trench and the second vertical trench have the same of option (a) and/or (b);
option (a) being:
the first and second vertical trenches extend, in said vertical direction, from said top layer beyond an upper boundary of the first drift region, and in a lateral direction parallel to the substrate top-surface electrically isolate, and define, the first drift region;
option (b) being: each of said first and second vertical trench comprising:
a gate electrode in an first part of the vertical trench, the gate electrode being electrically coupled to the body, for forming, when a suitable voltage is applied to the gate, a vertical channel in the body through which a current can flow from the first drift region to the second drift region or vice versa;
a lower shield plate, the shield plate being situated in a lower part of the trench, the lower part being closer to the substrate than the first part, for generating an accumulation layer in the first drift region when the lower shield plate is biased with respect to the first current terminal in a first polarity and locally reducing the electrical field density when the lower shield plate is biased with respect to the first current terminal in a second polarity; and a body-side vertical sidewall, and another vertical sidewall facing the body-side vertical sidewall, of which at least the body-side vertical sidewall is covered with a dielectric which separates the gate electrode and the shield plate from the body-side vertical sidewall, the dielectric being thicker in the first part than in the lower part;

a first current electrode connected to the first current terminal of each of said power transistors;

a second current electrode connected to the second current terminal of each of said power transistor; and a gate feed connected to the gate electrode of each power transistor wherein the first current electrode, second current electrode and gate feed are connectable to an external power supply.

18. A semiconductor product as claimed in claim 17, wherein the second current electrode is further connected to the shield plate of each transistor.

19. A semiconductor product as claimed in claim 17, further comprising a body electrode connectable to an external power supply and connected to the body of each of said power transistors.

20. A method of manufacturing a power transistor comprising:

providing on a substrate a layer stack extending over said substrate, and providing the layer stack with a first vertical trench and a second vertical trench, each of said vertical trenches extending in a vertical direction from a top layer of the stack towards the substrate;

providing a second current terminal on or above the top layer and a first current terminal, in said vertical direction, below the second current terminal; and providing an electrical path which can be selectively enabled or disabled to allow current to flow between the first current terminal and the second current terminal, providing the electrical path comprising:

providing a body between said first current terminal and said second current terminal, the body extending laterally between the first and second vertical trenches and vertically;

providing a first drift region, in said vertical direction, between the body and the first current terminal; and providing a second drift region, in said vertical direction, between the body and the second current terminal;

providing each of said first and second vertical trenches with a gate electrode in a first part of the vertical trench, the gate electrode being electrically coupled to the body;

providing a lower shield plate in a lower part of the trench closer to the substrate than the first part; and providing a body-side vertical sidewall of each of the vertical trenches with a dielectric which separates the gate electrode and the shield plate from the body-side vertical sidewall, the dielectric being thicker in the first part than in the lower part.

* * * * *